US009627600B2

(12) United States Patent
Iida et al.

(10) Patent No.: US 9,627,600 B2
(45) Date of Patent: Apr. 18, 2017

(54) MG—SI SYSTEM THERMOELECTRIC CONVERSION MATERIAL, METHOD FOR PRODUCING SAME, SINTERED BODY FOR THERMOELECTRIC CONVERSION, THERMOELECTRIC CONVERSION ELEMENT, AND THERMOELECTRIC CONVERSION MODULE

(71) Applicant: YASUNAGA CORPORATION, Iga-shi, Mie (JP)

(72) Inventors: Tsutomu Iida, Shinjuku-ku (JP); Yumiko Oto, Shinjuku-ku (JP); Ryosuke Miyahara, Shinjuku-ku (JP); Yutaka Taguchi, Iga (JP)

(73) Assignee: YASUNAGA CORPORATION (JP)

( * ) Notice: Subject to any disclaimer, the term of this patent is extended or adjusted under 35 U.S.C. 154(b) by 184 days.

(21) Appl. No.: 14/647,599

(22) PCT Filed: Nov. 25, 2013

(86) PCT No.: PCT/JP2013/081627
§ 371 (c)(1),
(2) Date: May 27, 2015

(87) PCT Pub. No.: WO2014/084163
PCT Pub. Date: Jun. 5, 2014

(65) Prior Publication Data
US 2015/0311419 A1    Oct. 29, 2015

(30) Foreign Application Priority Data

Nov. 27, 2012  (JP) ................ 2012-258776

(51) Int. Cl.
*H01L 35/18*  (2006.01)
*H01L 35/14*  (2006.01)
(Continued)

(52) U.S. Cl.
CPC ............. *H01L 35/22* (2013.01); *C22C 1/02* (2013.01); *C22C 1/0408* (2013.01); *C22C 23/00* (2013.01)

(58) Field of Classification Search
CPC .. H01L 35/22; C22C 1/02; C22C 1/04; C22C 1/08; C22C 23/00
See application file for complete search history.

(56) References Cited

U.S. PATENT DOCUMENTS 3,782,927 A * 1/1974 Nicolaou ................ H01L 35/20
                                                                              136/239
2010/0051081 A1  3/2010 Iida et al.
(Continued)

FOREIGN PATENT DOCUMENTS

EP        2690064 A1     1/2014
JP     2002-285274   * 10/2002
(Continued)

OTHER PUBLICATIONS

International Search Report corresponding to PCT/JP2013/081627; Date of Mailing: Jan. 7, 2014, with English translation.
Extended European Search Report for corresponding application No. 13858716.7 dated Nov. 27, 2015.

*Primary Examiner* — Carol M Koslow
*Assistant Examiner* — C Melissa Koslow
(74) *Attorney, Agent, or Firm* — Cantor Colburn LLP

(57) ABSTRACT

Provided are: an Mg—Si system thermoelectric conversion material which exhibits stably high thermoelectric conversion performance; a sintered body for thermoelectric conversion, which uses this Mg—Si system thermoelectric conversion material; a thermoelectric conversion element having excellent durability; and a thermoelectric conversion module. A method for producing an Mg—Si system thermoelectric conversion material according to the present invention comprises a step for heating and melting a starting (Continued)

material composition that contains Mg, Si, Sb and Zn. It is preferable that the contents of Sb and Zn in the starting material composition are respectively 0.1-3.0 at % in terms of atomic weight ratio.

9 Claims, 8 Drawing Sheets

(51) Int. Cl.
    *H01L 35/34*     (2006.01)
    *B22F 3/14*     (2006.01)
    *B22F 3/15*     (2006.01)
    *C22C 1/02*     (2006.01)
    *C22C 1/04*     (2006.01)
    *C22C 23/00*     (2006.01)
    *H01L 35/22*     (2006.01)

(56) References Cited

U.S. PATENT DOCUMENTS

2012/0097205 A1     4/2012   Iida et al.
2012/0114517 A1     5/2012   Itoh et al.

FOREIGN PATENT DOCUMENTS

| | | |
|---|---|---|
| JP | 2002285274 A | 10/2002 |
| JP | 2006128235 A | 5/2006 |
| JP | 2011029632 A | 2/2011 |
| JP | 2012104558 A | 5/2012 |
| JP | 2012201937 A | 10/2012 |
| WO | 2008075789 A1 | 6/2008 |
| WO | 2011002035 A1 | 1/2011 |
| WO | 2012046170 A1 | 4/2012 |

\* cited by examiner

MG—SI SYSTEM THERMOELECTRIC CONVERSION MATERIAL, METHOD FOR PRODUCING SAME, SINTERED BODY FOR THERMOELECTRIC CONVERSION, THERMOELECTRIC CONVERSION ELEMENT, AND THERMOELECTRIC CONVERSION MODULE

This is the U.S. national stage of application No. PCT/JP2013/081627 filed on Nov. 25, 2013. Priority under 35 U.S.C. §119(a) and 35 U.S.C. §365(b) is claimed from Japanese Application No. 2012-258776, filed Nov. 27, 2012, the disclosure of which is also incorporated herein by reference.

TECHNICAL FIELD

The present invention relates to an Mg—Si system thermoelectric conversion material, a method for producing the same, a sintered body for thermoelectric conversion using the Mg—Si system thermoelectric conversion material, a thermoelectric conversion element, and a thermoelectric conversion module.

BACKGROUND ART

In recent years, various means of effectively using a variety of energies have been considered in response to heightening environmental problems. In particular, accompanying the increase in industrial waste and the like, the effective utilization of waste heat generated during the incineration of these has become an issue. For example, waste heat recovery is performed in a large-scale waste incineration facility by generating high pressure steam from the waste heat, and generating electricity by causing a steam turbine to rotate by using this steam. However, in a medium-to-small scale waste incineration facility, which accounts for the large majority of waste incineration facilities, the amount of waste heat exhaust is small, and so the recovery method of generating electricity from the waste heat by way of a steam turbine or the like has not been feasible.

As an electricity generation method using waste heat that can be employed in such medium-to-small scale waste incineration facilities, for example, methods using thermoelectric conversion elements and thermoelectric conversion modules for reversibly performing thermoelectric conversion by utilizing the Seebeck effect or Peltier effect have been proposed.

The thermoelectric conversion element includes a thermoelectric conversion part, and a first electrode and a second electrode provided in the thermoelectric conversion part. The thermoelectric conversion part is a sintered body obtained by sintering a thermoelectric conversion material and cutting into a predetermined size. Meanwhile, the thermoelectric conversion module is a modularized thermoelectric conversion element. Bi—Te system, Pb—Te system, Si—Ge system, Fe—Si system, and Mg—Si system materials are known as the thermoelectric conversion materials. Among them, an Mg—Si system (based) thermoelectric conversion material is attracting attention as a thermoelectric conversion material having a small environmental load and being usable in a high temperature environment (Patent Documents 1 to 3, and the like).

Note that this thermoelectric conversion technology is applicable not only to the waste heat in waste incineration, but also waste heat discharged from various manufacturing factories, and various heats such as exhaust heat from automobiles, the heat of the earth, and solar heat.

Patent Document 1: Japanese Unexamined Patent Application, Publication No. 2002-285274
Patent Document 2: Japanese Unexamined Patent Application, Publication No. 2006-128235
Patent Document 3: Japanese Unexamined Patent Application, Publication No. 2011-029632

DISCLOSURE OF THE INVENTION

Problems to be Solved by the Invention

By the way, the Mg—Si system thermoelectric conversion material is mainly made of Mg and Si. To improve the characteristics, containing of elements other than Mg and Si has been widely performed. For example, Patent Document 3 has reported that containing of Sb in addition to Mg and Si improves thermoelectric conversion performance and high temperature durability.

However, according to the confirmation of the present inventors, there is a problem in that cracks easily occur when Sb is included, when a sintered body of a thermoelectric conversion material is produced or when a sintered body for a thermoelectric conversion part of a predetermined size is cut out of a sintered body.

The present invention has been made in view of the conventional problems, and an objective is to provide a production method with high productivity, which is not susceptible to the occurrence of cracks and thus has high yield when a sintered body of a thermoelectric conversion material is produced or when a sintered body for a thermoelectric conversion part of a predetermined size is cut out of a sintered body, and which is capable of cutting a plurality of sintered bodies for thermoelectric conversion parts out of one sintered body in cases where the sintered body is large in size. Furthermore, an objective of the present invention is to provide an Mg—Si system thermoelectric conversion material which exhibits stable high thermoelectric conversion performance; a sintered body for thermoelectric conversion which uses this Mg—Si system thermoelectric conversion material; a thermoelectric conversion element having excellent durability; and a thermoelectric conversion module.

Means for Solving the Problems

The present inventors have diligently studied in order to solve the above problem. As a result, the inventors have found that the above problem can be solved if Sb and Zn are mixed in addition to Mg and Si at the time of melting and synthesizing the Mg—Si system thermoelectric conversion material, and have completed the present invention. To be specific, the present invention provides the matters below.

[1] An Mg—Si system thermoelectric conversion material expressed by: a chemical composition formula: $Mg_{66.7-a}Si_{33.3-b}Sb_xZn_yA_z$ (A represents one or more types of elements selected from a group consisting of Al, Bi, P, Ga, As, In, Ag, Cu, Au, Ni, Fe, Mn, Co, Ta, Nd, Nb, and Pb. x, y, and z satisfy conditions of $0.1 \leq x \leq 3.0$, $0.1 \leq y \leq 3.0$, $0 \leq z \leq 3.0$, and $0.2 \leq x+y+z \leq 5.0$. a and b are positive numbers and satisfy a condition of $a+b=x+y+z$.).

[2] A sintered body for thermoelectric conversion made by sintering the Mg—Si system thermoelectric conversion material according to [1].

[3] A thermoelectric conversion element including: a thermoelectric conversion part made of the sintered body for thermoelectric conversion according to [2]; and a first electrode and a second electrode provided in the thermoelectric conversion part.

[4] A thermoelectric conversion module including: the thermoelectric conversion element according to [3].

[5] A method for producing an Mg—Si system thermoelectric conversion material including: a step of heating and melting a starting material composition containing Mg, Si, Sb, and Zn.

[6] The method for producing an Mg—Si system thermoelectric conversion material according to [5], wherein each of contents of Sb and Zn in the starting material composition are from 0.1 to 3.0 at % by atomic weight ratio, and a total of the contents of elements other than Mg and Si is from 0.2 to 5.0 at % by atomic weight ratio.

[7] An Mg—Si system thermoelectric conversion material produced by the method for producing an Mg—Si system thermoelectric conversion material according to [5] or [6].

Effects of the Invention

According to the present invention, a production method with high productivity can be provided which is not susceptible to the occurrence of cracks and thus has a high yield when a sintered body of a thermoelectric conversion material is produced or when a sintered body for a thermoelectric conversion part of a predetermined size is cut out of a sintered body, and which is capable of cutting a plurality of sintered bodies for thermoelectric conversion parts out of one sintered body in cases where the sintered body is large in size. Furthermore, according to the present invention, an Mg—Si system thermoelectric conversion material which exhibits stable high thermoelectric conversion performance; a sintered body for thermoelectric conversion which uses this Mg—Si system thermoelectric conversion material; a thermoelectric conversion element having excellent durability; and a thermoelectric conversion module can be provided.

PREFERRED MODE FOR CARRYING OUT THE INVENTION

Figure 1:
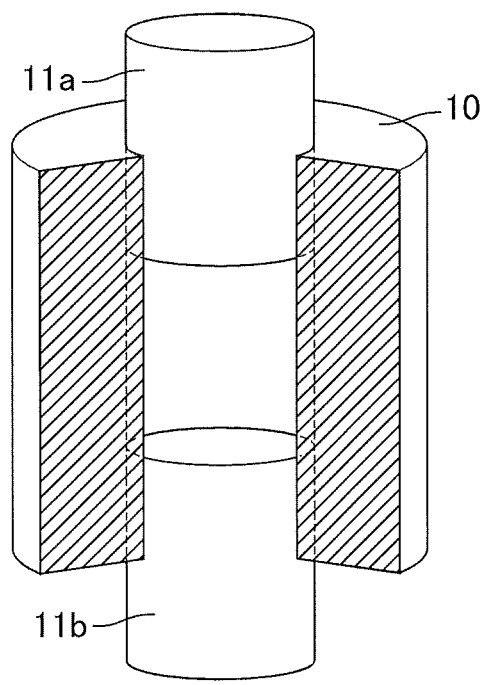
FIG. 1 is a diagram illustrating an example of a jig used for the sintering of an Mg—Si system thermoelectric conversion material.

Method for Producing Mg—Si system Thermoelectric Conversion Material

A method for producing an Mg—Si system thermoelectric conversion material according to the present invention includes a step of heating and melting a starting material composition that contains Mg, Si, Sb, and Zn.

As described above, the starting material composition contains Mg, Si, Sb, and Zn. However, the starting material composition may contain one or more types of element (hereinafter referred to as "arbitrary elements") selected from a group consisting of Al, Bi, P, Ga, As, In, Ag, Cu, Au, Ni, Fe, Mn, Co, Ta, Nd, Nb, and Pb, in addition to Mg, Si, Sb, and Zn. As starting materials, those with a high purity (for example, a purity of 99.9% or more) are favorably used.

The mixing ratio of Mg and Si in the starting material composition is 2:1 by atomic weight ratio. Furthermore, both the contents of Sb and of Zn in the starting material composition are favorably from 0.1 to 3.0 at % by atomic weight ratio, more favorably from 0.1 to 2.0 at %, still more favorably from 0.1 to 1.5 at %, and especially favorably from 0.5 to 1.0 at %. Furthermore, the contents of the arbitrary elements in the starting material composition are favorably from 0 to 3.0 at % by atomic weight ratio, more favorably from 0 to 2.0 at %, still more favorably from 0 to 1.5 at %, and especially favorably from 0 to 0.5 at %.

Furthermore, to replace/dissolve the elements such as Sb, Zn, and the like with a proportion of Mg or Si in an Mg2Si crystal structure, the total of the contents of the elements other than Mg and Si are favorably from 0.2 to 5.0 at % by atomic weight ratio, more favorably from 0.2 to 4.0 at %, still more favorably from 0.2 to 3.0 at %, especially favorably from 0.5 to 2.5 at %, and most favorably from 1.0 to 2.0 at %.

Note that, as a method for producing an Mg—Si system thermoelectric conversion material according to the present invention, a method using the starting material composition without including the arbitrary elements is favorable. The contents of Sb and Zn in this case are similar to those in the above description. Furthermore, the total of the contents of Sb and Zn is also similar to the case when the contents of the arbitrary elements are 0.

Such a starting material composition is heat-treated under a reducing atmosphere and favorably under reduced pressure, at a temperature of from the melting point of Mg to the melting point of Si (exclusive of the melting point of Si), to melt and synthesize the Mg—Si system thermoelectric conversion material according to the present invention.

Here, "under a reducing atmosphere" indicates an atmosphere particularly containing 5% by volume hydrogen gas, and containing inert gas(es) as the other component(s) as necessary. By heating and melting the starting material composition under such a reducing atmosphere, the starting material composition can be reliably reacted while avoiding generation of magnesium oxides, silicon oxides, and the like.

As a pressure condition in the heating and melting, although atmospheric pressure is acceptable, a reduced pressure condition of about 1.33×10-3 Pa is favorable when taking safety into consideration.

The heating temperature in the heating and melting is from 650° C. to 1414° C. (exclusive of 1414° C.), and favorably from 1085° C. to 1414° C. (exclusive of 1414° C.), and the heating time is from 2 to 10 hours, for example. By setting the heat treatment to a long time, the Mg—Si system thermoelectric conversion material to be obtained can be further homogenized. In addition, for example, 150 to 250° C./hour until reaching 150° C., and 350 to 450° C./hour until reaching 1100° C. can be exemplified as temperature increase conditions, and 900 to 1000° C./hour can be exemplified as a temperature decline condition after heat treatment.

The heating and melting is performed in a state when the starting material composition is charged into a melting crucible, and is sealed with a lid portion. It is favorable to polish a contacting surface of the melting crucible and the lid portion to enhance the contact property so that vaporized Mg and the like do not disperse during the heating and melting. Furthermore, it is favorable to pressurize the lid portion. Accordingly, an Mg—Si system thermoelectric conversion material having the same composition ratio as the starting material composition can be obtained. The thermoelectric conversion material does not contain Mg oxides, Si oxides, unreacted Mg, or unreacted Si. Therefore, the produced thermoelectric conversion element using the material has the expected high performance.

Note that one cooled after heated and melted as it is can be used as the Mg—Si system thermoelectric conversion material. However, it is favorable to pulverize the Mg—Si system thermoelectric conversion material into a fine powder with a particle diameter of several μm or less for convenience when sintering the powder.

Mg—Si System Thermoelectric Conversion Material

The Mg—Si system thermoelectric conversion material according to the present invention is produced by the above-described production method. The Mg—Si system thermoelectric conversion material is expressed by a chemical composition formula: $Mg_{66.7-a}Si_{33.3-b}Sb_xZn_yA_z$, for example.

Here, A represents the above-described arbitrary elements (one or more types of elements selected from a group consisting of Al, Bi, P, Ga, As, In, Ag, Cu, Au, Ni, Fe, Mn, Co, Ta, Nd, Nb, and Pb). x, y, and z satisfy the conditions of $0.1 \leq x \leq 3.0$, $0.1 \leq y \leq 3.0$, $0 \leq z \leq 3.0$, and $0.2 \leq x+y+z \leq 5.0$. a and b are positive numbers, and satisfy the condition of $a+b=x+y+z$. The ranges of x, y, and z are favorably $0.1 \leq x \leq 2.0$, $0.1 \leq y \leq 2.0$, and $0 \leq z \leq 2.0$, more favorably $0.1 \leq x \leq 1.5$, $0.1 \leq y \leq 1.5$, and $0 \leq z \leq 1.5$, and still more favorably $0.5 \leq x \leq 1.0$, $0.5 \leq y \leq 1.0$, and $0 \leq z \leq 0.5$. Furthermore, the range of x+y+z is favorably $0.2 \leq x+y+z \leq 4.0$, more favorably $0.2 \leq x+y+z \leq 3.0$, still more favorably $0.5 \leq x+y+z \leq 2.5$, and especially favorably $1.0 \leq x+y+z \leq 2.0$.

As the Mg—Si system thermoelectric conversion material according to the present invention, one without including the arbitrary elements A, that is, one expressed by the chemical composition formula: $Mg_{66.7-a}Si_{33.3-b}Sb_xZn_y$ is favorable (note that $a+b=x+y$). Favorable ranges of x and y in this chemical composition formula are similar to the above ranges. Furthermore, a favorable range of x+y is similar to a case where z=0 in the above description.

Note that Sb is replaced with an Si site in the Mg2Si crystal structure, and Zn is replaced with an Mg site in the Mg2Si crystal structure. Therefore, a chemical composition formula of when the arbitrary elements A are not contained can be imagined to be expressed by $Mg_{66.7-y}Si_{33.3-x}Sb_xZn_y$.

The Mg—Si system thermoelectric conversion material according to the present invention is not susceptible to the occurrence of cracks when producing the sintered body or cutting the sintered body into a predetermined size, and has high thermoelectric conversion performance. Note that the reason why the cracks are less likely to occur is not clear. However, Zn is thought to bring an effect to suppress the introduction of the cracks by contributing to enhancement of coupling among atoms in a microscopic perspective.

Sintered Body for Thermoelectric Conversion

A sintered body for thermoelectric conversion according to the present invention is obtained by sintering the Mg—Si system thermoelectric conversion material according to the present invention.

For the sintering, a pressurized sintering method such as a hot-press (HP) sintering method, a hot isostatic press (HIP) sintering method, or a spark plasma sintering method can be employed. Among them, the spark plasma sintering method is favorable. The spark plasma sintering method is one type of the pressurized sintering methods, using a DC pulse electric current method, and is a method of performing heating and sintering by applying a pulse of high current to various materials. In principle, the spark plasma sintering method is a method of causing the current to flow in conductive materials such as graphite and metal, and processing and treating a material by way of Joule heating.

In the spark plasma sintering method, a jig as illustrated in FIG. 1 is used, for example. In the sintering, first the Mg—Si system thermoelectric conversion material according to the present invention as powder is filled in a space enclosed by a die 10 made of graphite and punches 11a and 11b made of graphite. It is favorable to interpose carbon paper between the contact parts of the die 10 made of graphite and the punches 11a and 11b made of graphite to prevent adhesion of the Mg—Si system thermoelectric conversion material to the die and the punches. Following that, the Mg—Si system thermoelectric conversion material is sintered using a spark plasma sintering device.

The sintering pressure of the spark plasma sintering is favorably 5 to 60 MPa. When the sintering pressure is less than 5 MPa, it is difficult to obtain a sintered body with adequate density, and the strength may be insufficient. Meanwhile, when the sintering pressure exceeds 60 MPa, this is not favorable from a cost perspective.

Furthermore, the sintering temperature is favorably from 600° C. to 1000° C. When the sintering temperature is less than 600° C., it is difficult to obtain a sintered body with adequate density, and the strength may be insufficient. Meanwhile, when the sintering temperature exceeds 1000° C., not only may damage occur in the sintered body, but also Mg may suddenly vaporize and disperse.

Furthermore, the sintering is performed under reduced pressure and favorably under an inert gas atmosphere.

Note that the sintered body for thermoelectric conversion is typically produced using one type of thermoelectric conversion material. However, a sintered body having a multilayer structure may be produced using a plurality of types of thermoelectric conversion materials. The sintered body having a multilayer structure can be produced by layering the plurality of types of thermoelectric conversion materials in a desired order before sintering, and then sintering the layered materials. In this case, a plurality of types of Mg—Si system thermoelectric conversion material with different compositions, of the Mg—Si system thermoelectric conversion materials according to the present invention, may be combined and used, or the Mg—Si system thermoelectric conversion material according to the present invention and another Mg—Si system thermoelectric conversion material may be combined and used.

Furthermore, a sintered body integrated with an electrode can be obtained by filling an electrode material, the Mg—Si system thermoelectric conversion material, and an electrode material in this order in the space enclosed by the die 10 made of graphite and the punches 11a and 11b made of graphite as illustrated in FIG. 1, and sintering the filled materials. Such a sintered body is cut into a predetermined size so that the thermoelectric conversion element can be obtained.

Thermoelectric Conversion Element and Thermoelectric Conversion Module

A thermoelectric conversion element according to the present invention includes a thermoelectric conversion part made of the sintered body for thermoelectric conversion, and a first electrode and a second electrode provided in the thermoelectric conversion part. The thermoelectric conversion element stably exhibits high thermoelectric conversion performance, does not weather, and is excellent in terms of durability, and thus is excellent in terms of stability and reliability.

The thermoelectric conversion part is cut out of the sintered body using a wire saw or the like to have the desired size. In the present invention, a large sintered body with excellent physical strength without cracks, for example, a columnar sintered body with a large bore diameter of 30 mm or more can be obtained, and thus a large number of thermoelectric conversion parts can be cut out of one sintered body. Therefore, the present invention has high productivity. Note that it is favorable to use the cut sintered body after a surface thereof is polished and smoothed by a mirror finishing method or the like.

A method for forming the first electrode and the second electrode is not especially limited, and a known method can be employed. For example, the electrodes can be formed by using electroless nickel plating or the like to the sintered body.

Note that the first electrode and the second electrode may be formed after the thermoelectric conversion element is cut out of the sintered body, or the thermoelectric conversion element may be cut out after the first electrode and the second electrode are formed on the sintered body, when producing the thermoelectric conversion element.

Meanwhile, the thermoelectric conversion module according to the present invention includes the thermoelectric conversion element according to the present invention. The thermoelectric conversion module can be produced by modularizing the thermoelectric conversion element according to the present invention by a known method.

EXAMPLES

Hereinafter, the present invention will be described in detail by providing Examples. Noted that the present invention is not limited in any way to the Examples shown hereinafter.

Example 1

60.36 parts by mass of Mg (chip-shaped Mg having a purity of 99.93% and the size of 1.4 mm×0.5 mm, manufactured by Nippon Thermochemical Co. Ltd), 34.87 parts by mass of Si (granular silicon having a purity of 99.9999999% and a size of 4 mm in diameter or less, manufactured by MEMC Electronic Materials Corp.), 2.30 parts by mass of Sb (granular Sb having a purity of 99.9999% and a size of 5 mm in diameter or less, manufactured by Electronics and Materials Corp.), and 2.47 parts by mass of Zn (granular Zn having a purity of 99.9% and a size of 150 μm in diameter or less, manufactured by Kojundo Chemical Lab. Co., Ltd.) were mixed to obtain a starting material composition. The content of Sb was 0.5 at %, and the content of Zn was 1.0 at % in the starting material composition.

The obtained starting material composition was charged into a melting crucible made of Al2O3 (one with an internal diameter of 34 mm, an external diameter of 40 mm, and a height of 150 mm, a lid portion with a diameter of 40 mm and a thickness of 2.5 mm, and the melting crucible and the lid portion have a polished contacting surface, manufactured by Nihon Kagaku Togyo Kabushiki Kaisha was used). An opening portion of the melting crucible and the lid portion were made to come into close contact, left to stand inside a heating furnace, and then the pressure was increased with weight via ceramic rods from the outside of the heating furnace so as to be 3 kg/cm2.

Next, the inside of the heating furnace was decompressed with a rotary pump until the pressure was no more than 5 Pa, and then decompressed until it was 1.33×10-2 Pa with a diffusion pump. In this state, the inside of the heating furnace was heated at 200° C./hour until reaching 150° C., and then maintained at 150° C. for 1 hour to dry the starting material composition. At this time, a gas mixture containing hydrogen and argon was filled into the heating furnace, with the partial pressure of hydrogen gas being 0.005 MPa and the partial pressure of argon gas being 0.052 MPa.

Thereafter, it was heated at 400° C./hour until reaching 1150° C., and then maintained at 1150° C. for 3 hours. Subsequently, it was cooled at 100° C./hour until reaching 900° C., and then cooled at 1000° C./hour until reaching room temperature, whereby the Mg—Si system thermoelectric conversion material was obtained.

The obtained Mg—Si system thermoelectric conversion material was pulverized to a grain size 25 to 75 μm using an automatic mortar. Then, the powder of the Mg—Si system thermoelectric conversion material was filled in the space enclosed by the die 10 made of graphite (with an inside diameter of 15 mm) and the punches 11a and 11b made of graphite as illustrated in FIG. 1. Carbon paper was interposed between the contact parts of the die 10 made of graphite and the punches 11a and 11b made of graphite to prevent adhesion of the Mg—Si system thermoelectric conversion material to the die and the punches.

Thereafter, sintering was performed under a reduced pressure atmosphere using a spark plasma sintering device ("PAS-III-Es" manufactured by ELENIX Co., Ltd.) to obtain a sintered body. The sintering conditions were as follows:

Sintering temperature: 840° C.
Pressure: 30.0 MPa
Temperature increasing rate: 300° C./min×2 min (to 600° C.)
100° C./min×2 min (600 to 800° C.)
10° C./min×4 min (800° C. to 840° C.)
0° C./min×5 min (840° C.)
Cooling conditions: vacuum cooling
Atmosphere: Ar 60 Pa (vacuum during cooling)

After the sintering, the attached carbon paper was removed with sand paper. Note that the obtained sintered body has a pillar shape (the upper surface and the bottom surface are circles with a diameter of 15 mm and a height of 10 mm).

Figure 2A:
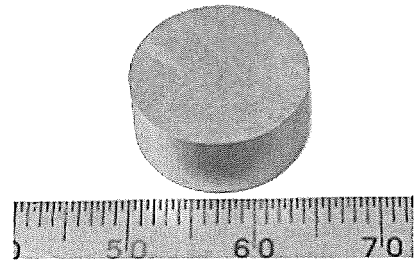
FIGS. 2(a) and 2(b) are diagrams illustrating the appearance of a sintered body obtained in Example 1 (FIG. 2(a)), and a diagram illustrating an optical microscope image of a cut section (FIG. 2(b)).

The appearance of the obtained sintered body is illustrated in FIG. 2(a). Furthermore, the sintered body was cut along the diameter, using a wire saw ("CS-203" manufactured by Musashino Denshi), and the cut section was mirror finished, using an automatic polisher ("MA-150" manufactured by Musashino Denshi). The result of observing the mirror-finished cut section with an optical microscope (magnification 200 times) is illustrated in FIG. 2(b).

Figure 2B:
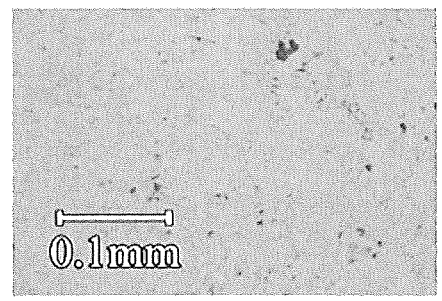

As it is clear from FIGS. 2(a) and 2(b), it was possible to obtain a dense sintered body without voids.

Comparative Example 1

63.39 parts by mass of Mg (chip-shaped Mg having a purity of 99.93% and a size of 1.4 mm×0.5 mm, manufactured by Nippon Thermochemical Co. Ltd) and 36.61 parts by mass of Si (granular silicon having a purity of 99.9999999% and a size of 4 mm diameter or less, manufactured by MEMC Electronic Materials Corp.) were mixed to obtain a starting material composition. Then, a sintered body was obtained using the starting material composition, similarly to Example 1.

Comparative Example 2

62.24 parts by mass of Mg (chip-shaped Mg having a purity of 99.93% and a size of 1.4 mm×0.5 mm, manufactured by Nippon Thermochemical Co. Ltd), 35.42 parts by mass of Si (granular silicon having a purity of 99.9999999% and a size of 4 mm in diameter or less, manufactured by MEMC Electronic Materials Corp.), and 2.34 parts by mass of Sb (granular Sb having a purity of 99.9999% and a size of 5 mm in diameter or less, manufactured by Electronics and Materials Corp.) were mixed to obtain a starting material composition. The content of Sb in the starting material composition was 0.5 at %. Then, a sintered body was obtained using the starting material composition, similarly to Example 1.

Comparative Example 3

62.37 parts by mass of Mg (chip-shaped Mg having a purity of 99.93% and a size of 1.4 mm×0.5 mm, manufactured by Nippon Thermochemical Co. Ltd), 36.58 parts by mass of Si (granular silicon having a purity of 99.9999999% and a size of 4 mm in diameter or less, manufactured by MEMC Electronic Materials Corp.), and 1.05 parts by mass of Al (chip-shaped Mg having a purity of 99.99% and a size of 10 mm×15 mm×0.5 mm, manufactured by Furuuchi Chemical Corporation) were mixed to obtain a starting material composition. The content of Al in the starting material composition was 1.0 at %. Then, a sintered body was obtained using the starting material composition, similarly to Example 1.

Comparative Example 4

61.45 parts by mass of Mg (chip-shaped Mg having a purity of 99.93% and a size of 1.4 mm×0.5 mm, manufactured by Nippon Thermochemical Co. Ltd), 36.04 parts by mass of Si (granular silicon having a purity of 99.9999999% and a size of 4 mm in diameter or less, manufactured by MEMC Electronic Materials Corp.), and 2.52 parts by mass of Zn (granular Zn having a purity of 99.9% and a size of 150 μm in diameter or less, manufactured by Kojundo Chemical Lab. Co., Ltd.) were mixed to obtain a starting material composition. The content of Zn in the starting material composition was 1.0 at %. Then, a sintered body was obtained using the starting material composition, similarly to Example 1.

Comparative Example 5

61.25 parts by mass of Mg (chip-shaped Mg having a purity of 99.93% and a size of 1.4 mm×0.5 mm, manufactured by Nippon Thermochemical Co. Ltd), 35.38 parts by mass of Si (granular silicon having a purity of 99.9999999% and a size of 4 mm in diameter or less, manufactured by MEMC Electronic Materials Corp.), 2.34 parts by mass of Sb (granular Sb having a purity of 99.9999% and a size of 5 mm in diameter or less, manufactured by Electronics and Materials Corp.), and 1.04 parts by mass of Al (chip-shaped Mg having a purity of 99.99% and a size of 10 mm×15 mm×0.5 mm, manufactured by Furuuchi Chemical Corporation) were mixed to obtain a starting material composition. The content of Sb was 0.5 at % and the content of Al was 1.0 at % in the starting material composition. Then, a sintered body was obtained using the starting material composition, similarly to Example 1.

Evaluation of Existence or Non-existence of Occurrence of Cracks

Samples having 2.0 mm×2.0 mm×8.0 mm were respectively cut out of the sintered bodies obtained in Example 1, and Comparative Examples 2 and 5, using a wire saw ("CS-203" manufactured by Musashino Denshi), and the number of samples with the occurrence of cracks and the number of samples without the occurrence of cracks were confirmed. Furthermore, the yield was calculated from the confirmation result. Results are illustrated in Table 1.

TABLE 1

|  | Example 1 | Comparative Example 2 | Comparative Example 5 |
|---|---|---|---|
| No cracks (number) | 8 | 8 | 6 |
| Cracks (number) | 0 | 15 | 0 |
| Yield (%) | 100 | 34.7 | 100 |

As illustrated in Table 1, the sintered body of Comparative Example 2, which contains Sb as the element other than Mg and Si, was susceptible to the occurrence of cracks, and the yield was 34.7%, which is low. Meanwhile, the sintered body of Example 1, which contains Sb and Zn as the elements other than Mg and Si, and the sintered body of Comparative Example 5, which contains Sb and Al, were less susceptible to the occurrence of cracks, and the yield was 100%.

Evaluation of Thermoelectric Conversion Characteristics (Calculation of Seebeck Coefficient)

Samples with dimensions of 2.0 mm×2.0 mm×8.0 mm were respectively cut out of the sintered bodies obtained in Example 1, and Comparative Examples 1 to 5, using a wire saw ("CS-203" manufactured by Musashino Denshi). After the surfaces of the samples were roughly polished, the samples were measured for the Seebeck coefficient, using a Seebeck coefficient measuring device ("ZEM-2" manufactured by Ulvac Riko, Inc.), as described below.

Figure 3:
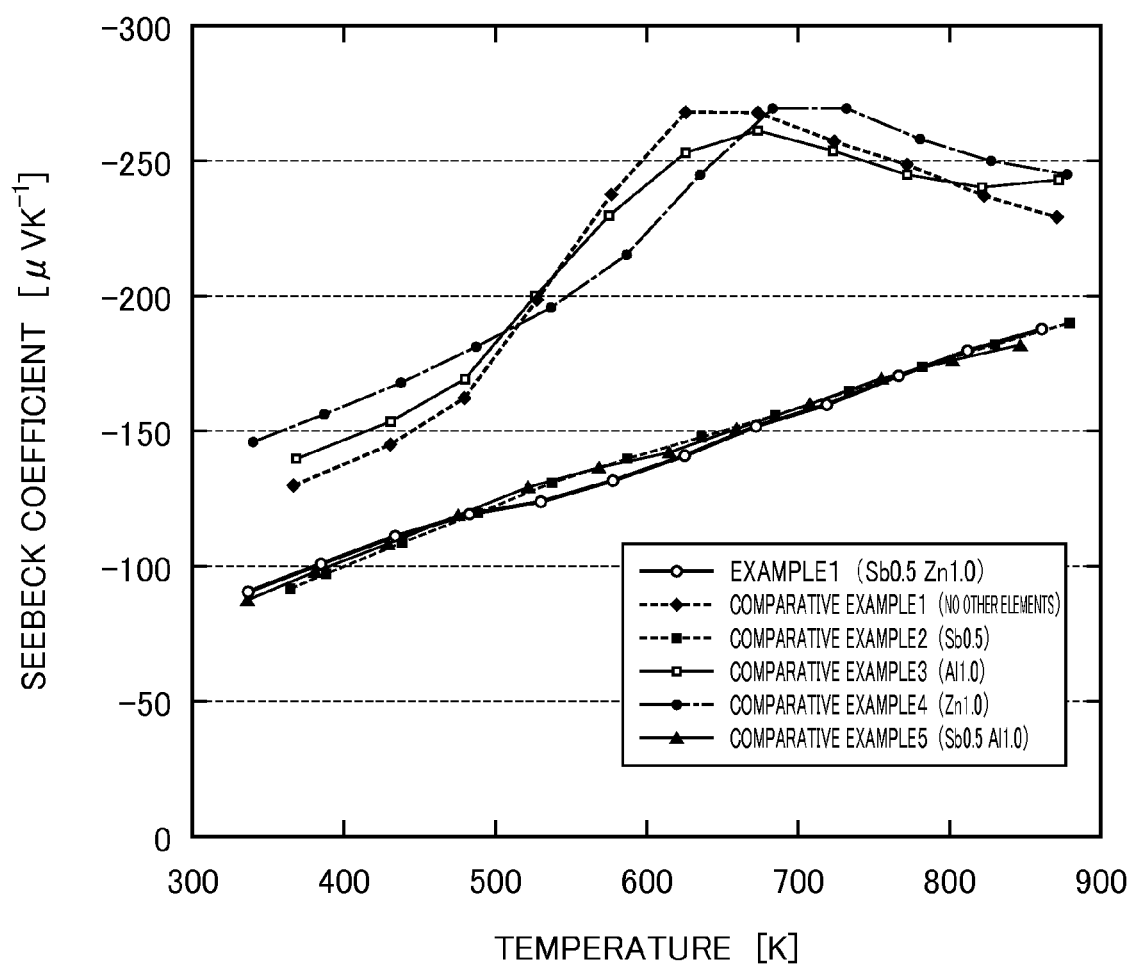
FIG. 3 is a diagram illustrating Seebeck coefficients at each temperature of the sintered bodies obtained in Example 1, and Comparative Examples 1 to 5.

First, an upper end and a lower end of the sample were sandwiched between nickel electrodes, and a thermocouple for temperature measurement (probe) was made to come into contact with it from a side. The measuring temperature was 50° C. to up to 600° C., and measurement was performed at 50° C. intervals. Furthermore, the measuring atmosphere was an He atmosphere, and the temperature difference between the electrodes was set to 20° C., 30° C., and 40° C. Then, the thermal electromotive force generated between the sample and the probes, and the temperature difference of the sample were measured. The Seebeck coefficient was calculated by dividing the thermal electromotive force by the temperature difference. The results are illustrated in FIG. 3.

(Calculation of Electrical Conductivity)

Figure 4:
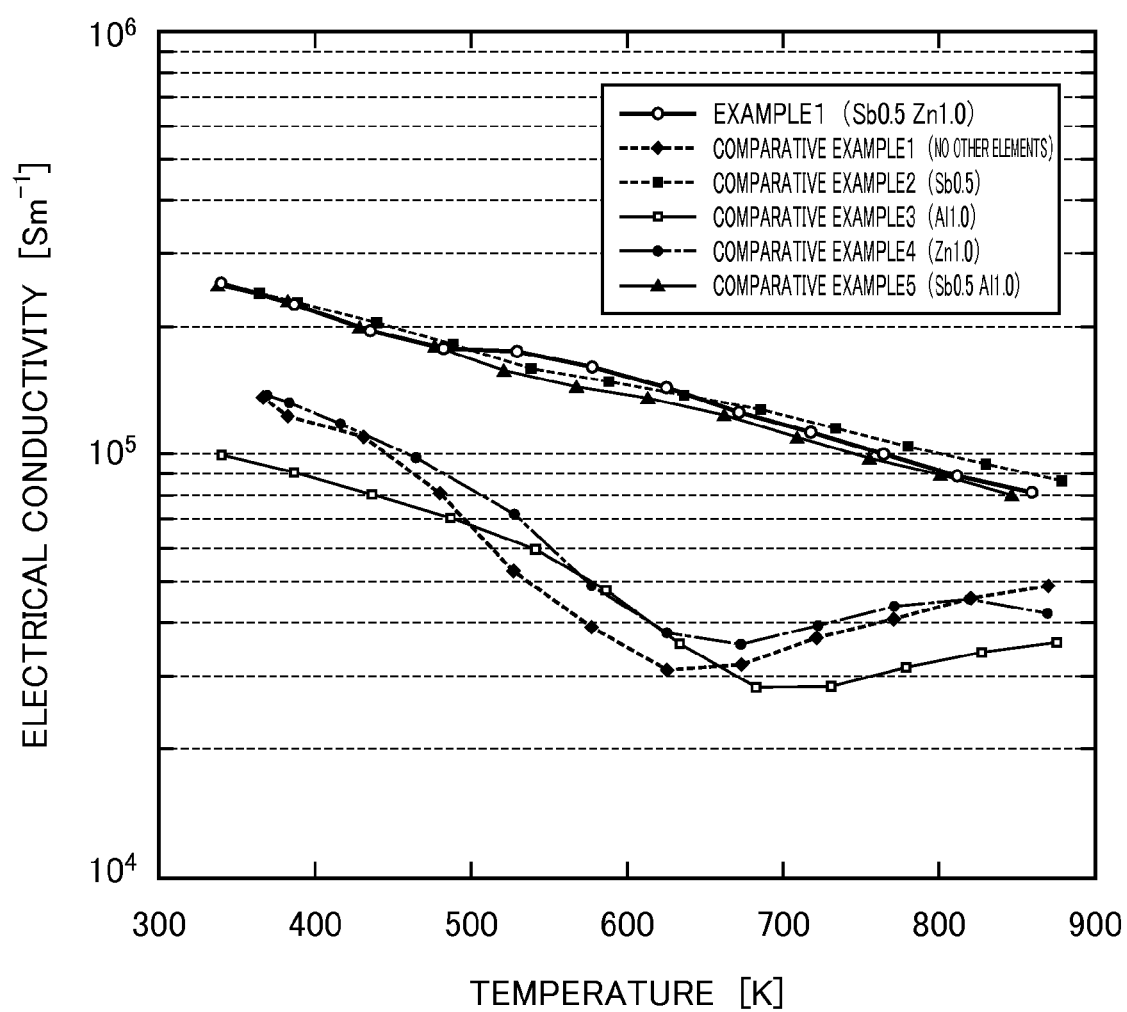
FIG. 4 is a diagram illustrating electrical conductivity at each temperature of the sintered bodies obtained in Example 1, and Comparative Examples 1 to 5.

Similarly to the above description, a resistance value was measured by a four-terminal method, using the upper and lower electrodes and the probes, resistivity was calculated from the distance between the probes and a cross-section area of the sample, and electrical conductivity was calculated from the inverse number. The results are illustrated in FIG. 4.

(Calculation of Power Factor)

Figure 5:
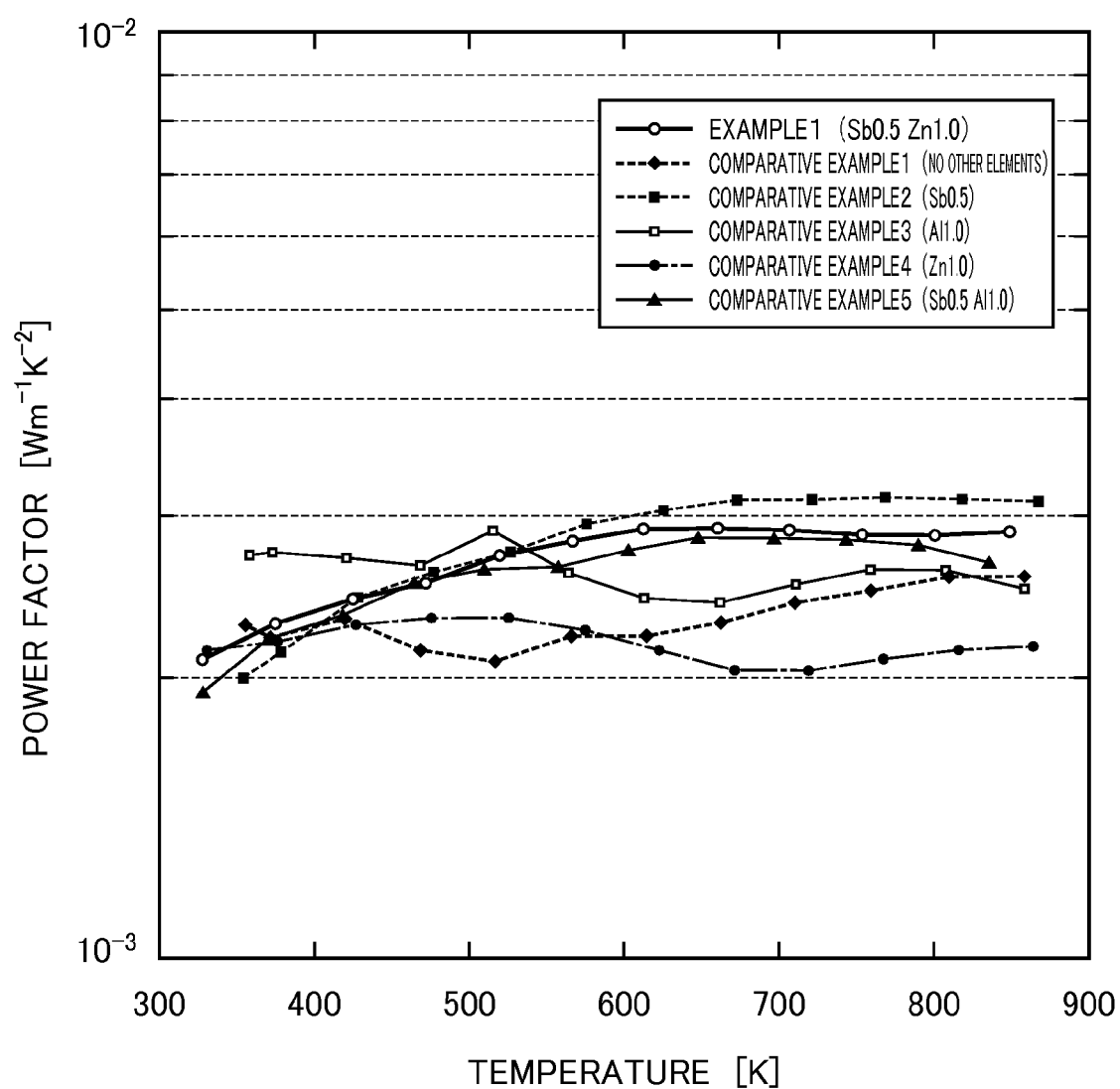
FIG. 5 is a diagram illustrating power factors at each temperature of the sintered bodies obtained in Example 1, and Comparative Examples 1 to 5.

Power factors were calculated using the Seebeck coefficients and the electrical conductivity calculated as described above. The results are illustrated in FIG. 5.

(Calculation of Thermal Conductivity)

Samples having dimensions of 8.0 mm×8.0 mm×1.0 mm were cut out of the sintered bodies obtained in Example 1, and Comparative Examples 1 to 5, using a wire saw ("CS-203" manufactured by Musashino Denshi). After the surfaces of the samples were roughly polished, a type R thermocouple was glued to the corners of one of the 8 mm×8 mm surfaces with a silver paste. Then, the thermal conductivity was measured for the sample using a laser flash method thermal conductivity measuring device ("TC-7000H" manufactured by Ulvac Riko, Inc.).

Figure 6:
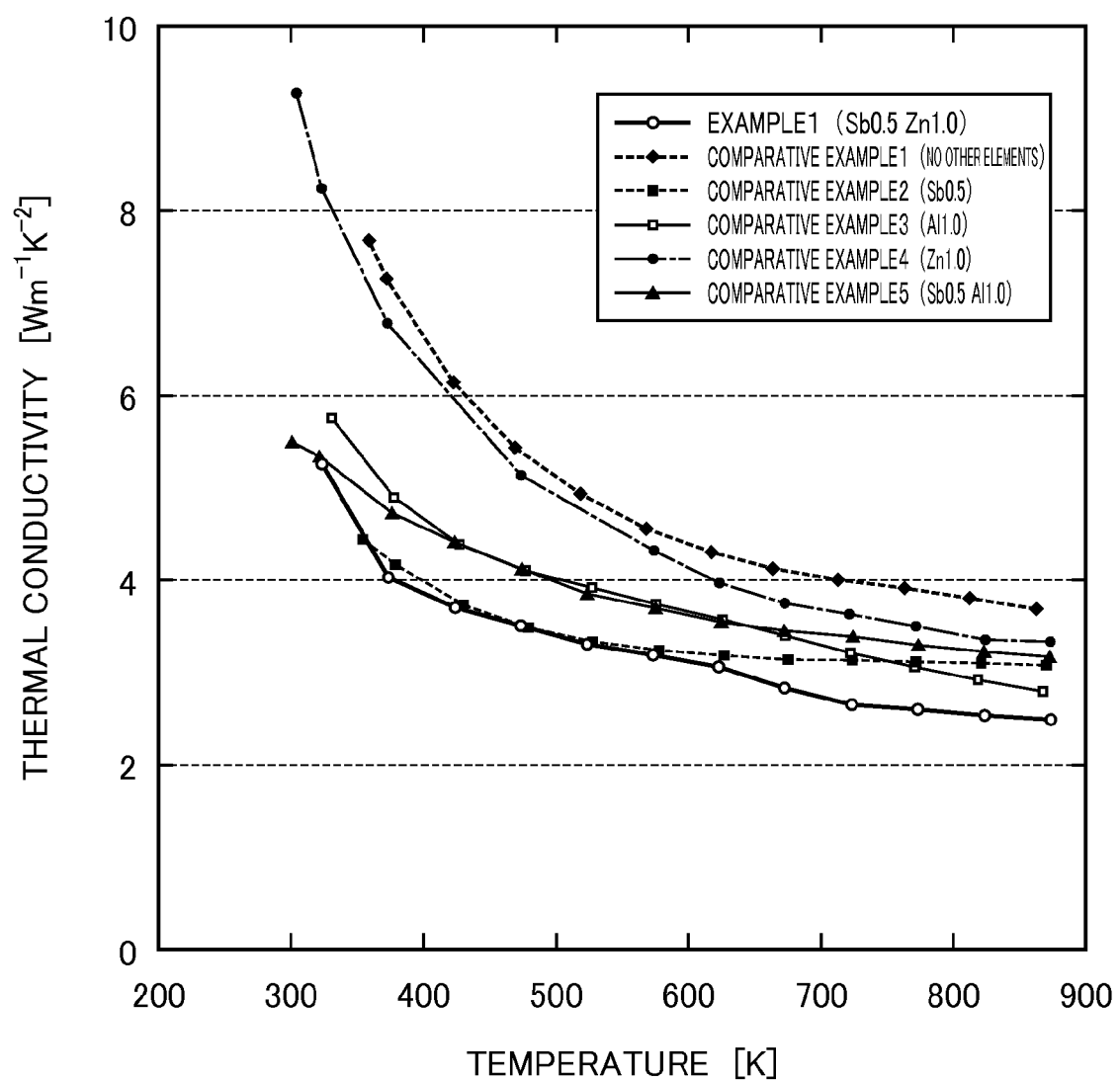
FIG. 6 is a diagram illustrating thermal conductivity at each temperature of the sintered bodies obtained in Example 1, and Comparative Examples 1 to 5.

First, the absorbed heat amount was measured using a standard sample (sapphire) with known specific heat. Following that, the sapphire was taken out and the sample was inserted, and the absorbed heat amount was measured. Following that, blackening treatment with a graphite spray was uniformly performed on the surface having the type R thermocouple, for thermal diffusivity measurement. Note that, in the blackening treatment, masking was provided on the silver paste so that the graphite spray was not sprayed onto the sliver paste. The thermal diffusivity was measured at 50° C. intervals from 50° C. to 600° C., and the thermal conductivity was calculated from the thermal diffusivity, the specific heat, and the density of the sample. The results are illustrated in FIG. 6.

(Calculation of Dimensionless Figure-of-Merit Parameter)

Figure 7:
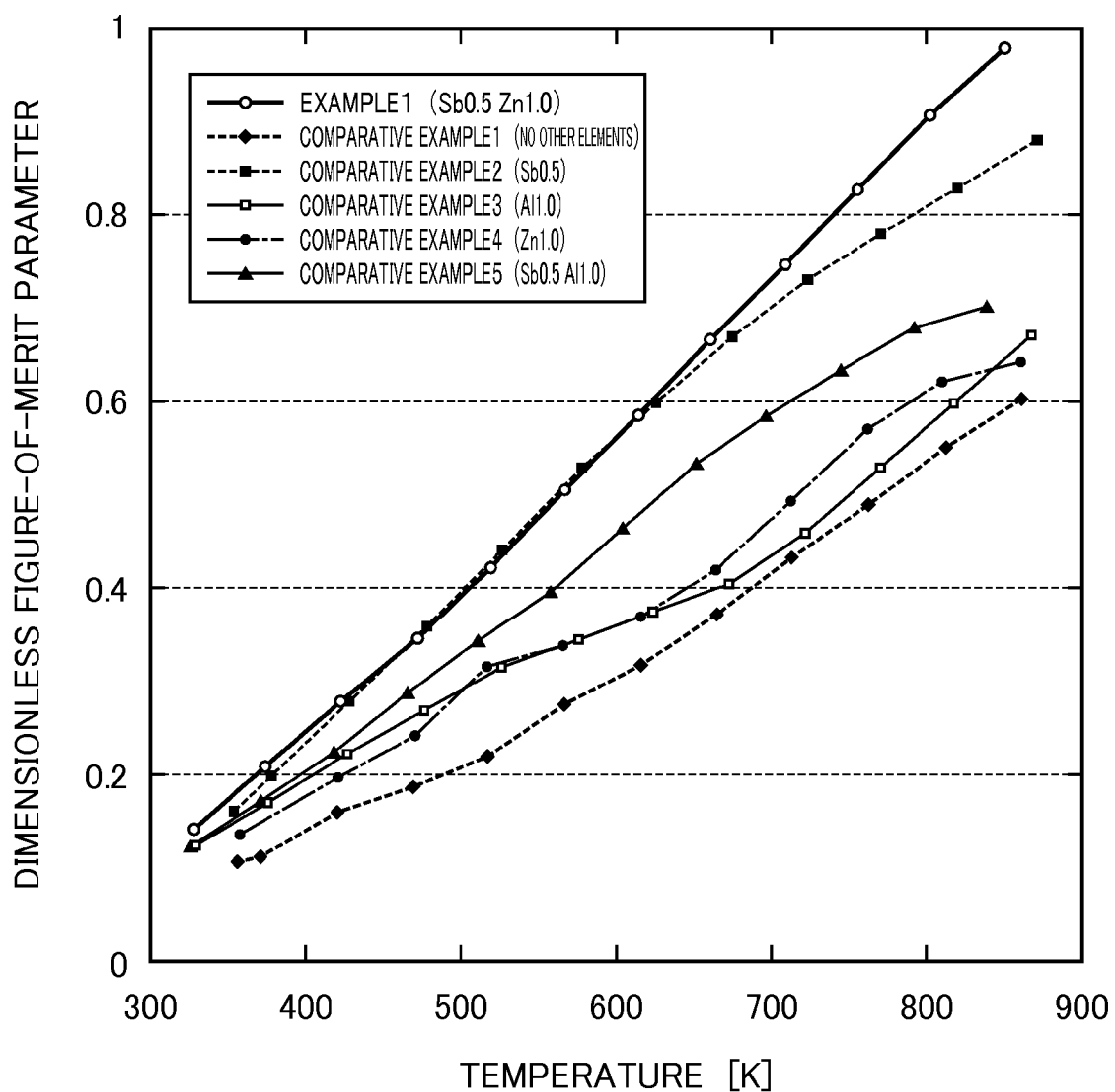
FIG. 7 is a diagram illustrating dimensionless figure-of-merit parameters at each temperature of the sintered bodies obtained in Example 1, and Comparative Examples 1 to 5.

The dimensionless figure-of-merit parameters (ZT) were calculated using the Seebeck coefficients, the electrical conductivity, and the thermal conductivity calculated as described above. The results are illustrated in FIG. 7.

As illustrated in FIGS. 3 to 7, while the sintered body of Example 1, which contains Sb and Zn as the elements other than Mg and Si, had a smaller absolute value of the Seebeck coefficient than the sintered body of Comparative Example 1, which does not contain the elements other than Mg and Si, the sintered body of Example 1 had a larger value of electrical conductivity, and a smaller value of thermal conductivity, than the sintered body of Comparative Example 1. As a result, the dimensionless figure-of-merit parameter at 873 K of 0.98 can be realized.

Meanwhile, the sintered body of Comparative Example 2, which contains Sb as the element other than Mg and Si, had a larger value of thermal conductivity than the sintered body of Example 1. As a result, the dimensionless figure-of-merit parameter at 873 K remained at 0.88.

Furthermore, while the sintered bodies of Comparative Examples 3 and 4, which contain Al or Zn as the element other than Mg and Si, had larger absolute values of Seebeck coefficient, and smaller values of thermal conductivity, than the sintered body of Comparative Example 1, the sintered bodies of Comparative Examples 3 and 4 had smaller values of electrical conductivity than the sintered body of Comparative Example 1. As a result, the dimensionless figure-of-merit parameters were not improved much.

Furthermore, while the sintered body of Comparative Example 5, which contains Sb and Al as the elements other than Mg and Si, had a similar value of thermal conductivity to the sintered body of Comparative Example 2, the sintered body of Comparative Example 5 had a smaller value of power factor than the sintered body of Comparative Example 2. As result, the dimensionless figure-of-merit parameter at 873 K remained at 0.69.

Evaluation of High Temperature Durability

Samples having dimensions of 10.0 mm×10.0 mm×2.0 mm were cut out of the sintered bodies obtained in Example 1, and Comparative Examples 2 to 5, using a wire saw ("CS-203" manufactured by Musashino Denshi). After surface oxide films of the samples were removed using an automatic polisher ("MA-150" manufactured by Musashino Denshi), the electrical resistivity was measured using a four-probe measuring device ("K-503RS" manufactured by Kyowariken Co. Ltd.), as described below.

First, the sample was set on a stage of the four-probe measuring device, probes were pressed onto the sample, the voltage of when an arbitrary current was applied was obtained, and a resistance value was calculated. At that time, the interval between the four probes that were in contact with the measuring surface was 1 mm. Furthermore, the current condition was up to 30 mA. Next, the electrical resistivity was calculated by multiplying the obtained resistance value with a correction coefficient. The correction coefficient is expressed by w×C×F, and w represents the thickness of the sample. Furthermore, C is a correction coefficient for the longitudinal and lateral lengths of the sample, and C=4.2209 (which was derived from the measuring surface of 10.0 mm×10.0 mm, and the interval between the probes of 1 mm). Furthermore, F is a correction coefficient for the thickness of the sample. F was calculated from the relationship of Table 2 below, because the thickness of the sample varies depending on polishing.

TABLE 2

| Thickness of sample/ interval between probes | Correction coefficient F |
| --- | --- |
| 1.0 | 0.9214 |
| 1.1111 | 0.8907 |
| 1.25 | 0.8490 |
| 1.4286 | 0.7938 |
| 1.6666 | 0.7225 |
| 2.0 | 0.6336 |

After the resistivity was calculated, the sample was put in a tube furnace kept at 600° C. in the atmosphere. After one hour elapsed, the sample was taken out of the tube furnace, the measuring surface was polished, and the electrical resistivity was calculated using a method similar to the above-described method. Similarly, the sample was taken out at stages where the heating time in the tube furnace was 5, 10, 50, 100, 500, 1000 hours, and the electrical resistivity was calculated. The results are illustrated in FIG. 8.

Figure 8:
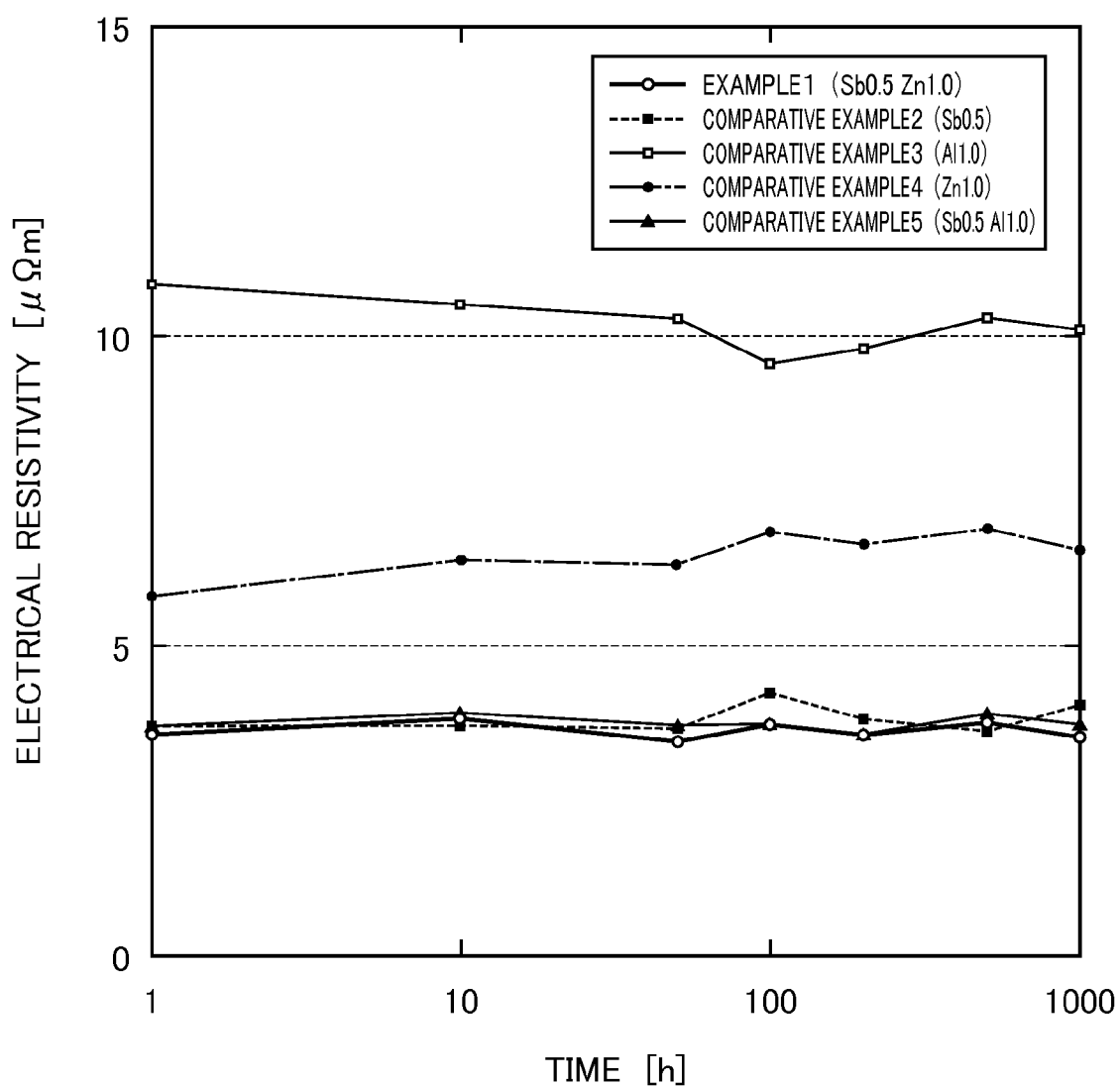
FIG. 8 is a diagram illustrating electrical resistivity change when high-temperature durability tests were performed on the sintered bodies obtained in Example 1, and Comparative Examples 2 to 5.

As illustrated in FIG. 8, the sintered body of Example 1, which contains Sb and Zn as the elements other than Mg and Si, had low electrical resistivity, similar to the sintered body of Comparative Example 2, which contains Sb as the element other than Mg and Si, and was excellent in terms of high-temperature durability.

Example 2

61.29 parts by mass of Mg (chip-shaped Mg having a purity of 99.93% and a size of 1.4 mm×0.5 mm, manufactured by Nippon Thermochemical Co. Ltd), 35.14 parts by mass of Si (granular silicon having a purity of 99.9999999% and a size of 4 mm in diameter or less, manufactured by MEMC Electronic Materials Corp.), 2.32 parts by mass of Sb (granular Sb having a purity of 99.9999% and a size of 5 mm in diameter or less, manufactured by Electronics and Materials Corp.), and 1.25 parts by mass of Zn (granular Zn having a purity of 99.9% and a size of 150 μm in diameter or less, manufactured by Kojundo Chemical Lab. Co., Ltd.) were mixed to obtain a starting material composition. The content of Sb was 0.5 at %, and the content of Zn was 0.5 at % in the starting material composition. Then, a sintered body was obtained using the starting material composition, similarly to Example 1.

Example 3

59.31 parts by mass of Mg (chip-shaped Mg having a purity of 99.93% and a size of 1.4 mm×0.5 mm, manufactured by Nippon Thermochemical Co. Ltd), 33.74 parts by mass of Si (granular silicon having a purity of 99.9999999% and a size of 4 mm in diameter or less, manufactured by MEMC Electronic Materials Corp.), 4.52 parts by mass of Sb (granular Sb having a purity of 99.9999% and the a of 5 mm in diameter or less, manufactured by Electronics and Materials Corp.), and 2.43 parts by mass of Zn (granular Zn having a purity of 99.9% and a size of 150 μm in diameter or less, manufactured by Kojundo Chemical Lab. Co., Ltd.) were mixed to obtain a starting material composition. The content of Sb was 1.0 at % and the content of Zn was 1.0 at % in the starting material composition. Then, a sintered body was obtained using the starting material composition, similarly to Example 1.

Example 4

60.22 parts by mass of Mg (chip-shaped Mg having a purity of 99.93% and a size of 1.4 mm×0.5 mm, manufactured by Nippon Thermochemical Co. Ltd), 34.00 parts by mass of Si (granular silicon having a purity of 99.9999999% and a size of 4 mm in diameter or less, manufactured by MEMC Electronic Materials Corp.), 4.56 parts by mass of Sb (granular Sb having a purity of 99.9999% and a size of 5 mm in diameter or less, manufactured by Electronics and Materials Corp.), and 1.41 parts by mass of Zn (granular Zn having a purity of 99.9% and a size of 150 μm in diameter or less, manufactured by Kojundo Chemical Lab. Co., Ltd.) were mixed to obtain a starting material composition. The content of Sb was 1.0 at % and the content of Zn was 0.5 at % in the starting material composition. Then, a sintered body was obtained using the starting material composition, similarly to Example 1.

Comparative Example 6

61.14 parts by mass of Mg (chip-shaped Mg having a purity of 99.93% and a size of 1.4 mm×0.5 mm, manufactured by Nippon Thermochemical Co. Ltd), 34.26 parts by mass of Si (granular silicon having a purity of 99.9999999% and a size of 4 mm in diameter or less, manufactured by MEMC Electronic Materials Corp.), and 4.59 parts by mass of Sb (granular Sb having a purity of 99.9999% and a size of 5 mm in diameter or less, manufactured by Electronics and Materials Corp.) were mixed to obtain a starting material composition. The content of Sb in the starting material composition was 1.0 at %. Then, production of a sintered body was attempted using the starting material composition, similarly to Example 1. However, cracks occurred, and the sintered body could not be obtained.

Evaluation of Existence or Non-Existence of the Occurrence of Cracks

Two samples having dimensions of 8.0 mm×8.0 mm×1.0 mm and three samples having dimensions of 2.0 mm×2.0 mm×12.0 mm were cut out of the sintered bodies obtained in Examples 2 to 4, using a wire saw ("CS-203" manufactured by Musashino Denshi), and the existence or non-existence of cracks was confirmed. As a result, no cracks occurred in the samples.

Evaluation of Thermoelectric Conversion Characteristics

Similarly to Example 1, and Comparative Example 1 to 5, the Seebeck coefficients, the electrical conductivity, and the thermal conductivity were obtained for the sintered bodies obtained in Examples 2 to 4, and the dimensionless figure-of-merit parameters (ZT) were calculated. The results are illustrated in FIG. 9.

Figure 9:
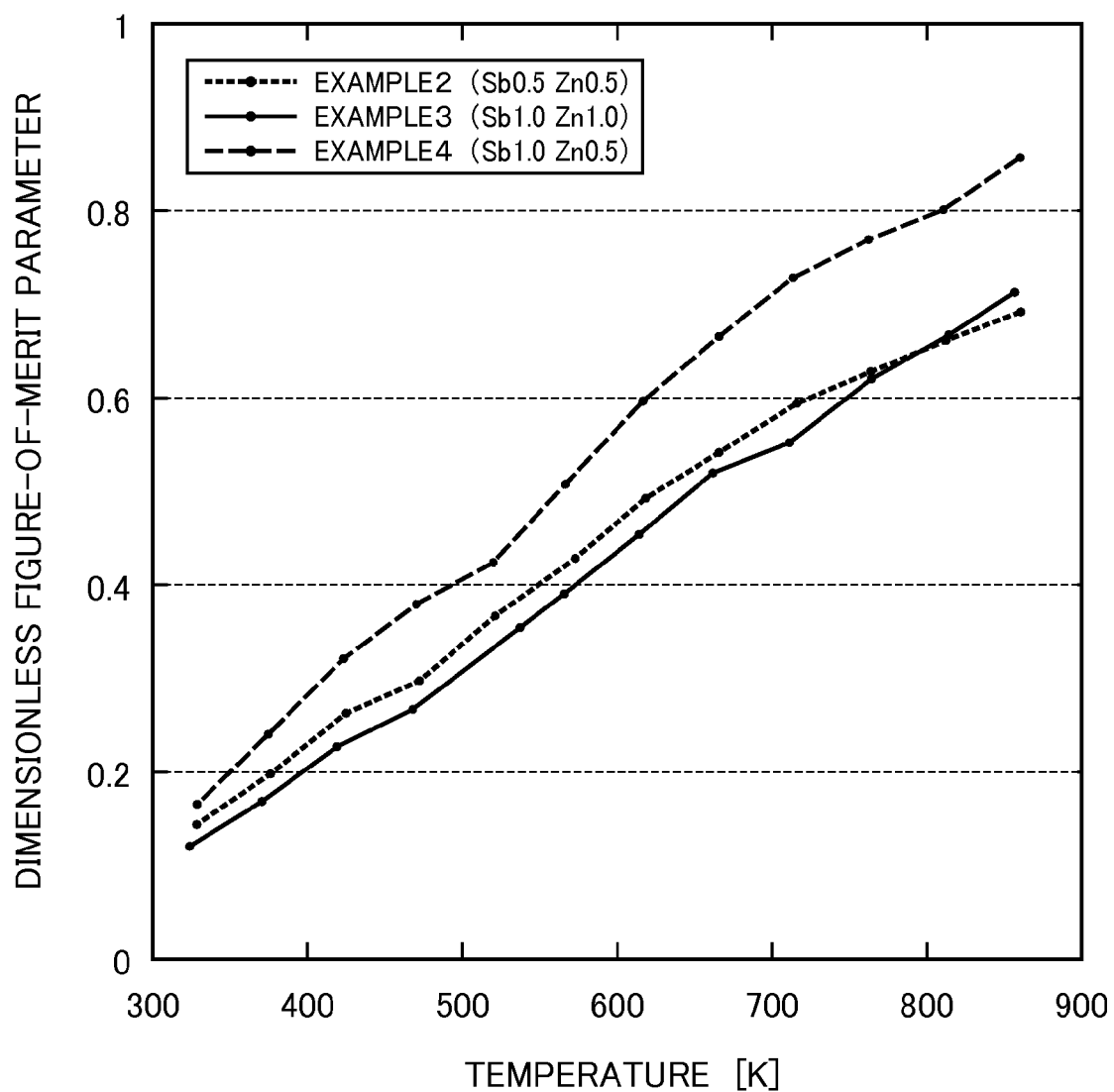
FIG. 9 is a diagram illustrating dimensionless figure-of-merit parameters at each temperature of the sintered bodies obtained in Examples 2 to 4.

As illustrated in FIG. 9, all of the sintered bodies of Examples 2 to 4, which contain Sb and Zn as the elements other than Mg and Si, had the dimensionless figure-of-merit parameter at 873 K of 0.7 or more, and were excellent in terms of the thermoelectric conversion performance.

EXPLANATION OF REFERENCE NUMERALS

10 Die made of graphite
11*a* and 11*b* Punch made of graphite

The invention claimed is:
1. An Mg—Si system thermoelectric conversion material expressed by: a chemical composition formula: $Mg_{66.7-a}Si_{33.3-b}Sb_xZn_yA_z$
(A represents one or more types of elements selected from a group consisting of Al, Bi, P, Ga, As, In, Ag, Cu, Au, Ni, Fe, Mn, Co, Ta, Nd, Nb, and Pb, x, y, and z satisfy conditions of $0.1 \leq x \leq 3.0$, $0.1 \leq y \leq 3.0$, $0 \leq z \leq 3.0$, and $0.2 \leq x+y+z \leq 5.0$, a and b are positive numbers and satisfy a condition of $a+b=x+y+z$.).
2. A sintered body made by sintering the Mg—Si system thermoelectric conversion material according to claim 1.
3. A thermoelectric conversion element comprising:
a thermoelectric conversion part made of the sintered body according to claim 2, and a first electrode and a second electrode provided in the thermoelectric conversion part.
4. A thermoelectric conversion module comprising:
the thermoelectric conversion element according to claim 3.
5. A method for producing an Mg—Si system thermoelectric conversion material comprising:
a step of heating and melting a starting material composition containing Mg, Si, Sb, and Zn.
6. The method for producing an Mg—Si system thermoelectric conversion material according to claim 5,
wherein each of contents of Sb and Zn in the starting material composition are from 0.1 to 3.0 at % by atomic weight ratio, and a total of the contents of elements other than Mg and Si is from 0.2 to 5.0 at % by atomic weight ratio.

7. An Mg—Si system thermoelectric conversion material produced by the method for producing an Mg—Si system thermoelectric conversion material according to claim 5.

8. An Mg—Si system thermoelectric conversion material produced by the method for producing an Mg—Si system thermoelectric conversion material according to claim 6.

9. A method of thermoelectric conversion, the method comprising:
   using the sintered body according to claim 2.

* * * * *